(12) United States Patent  
Huang et al.

(10) Patent No.: US 7,829,905 B2
(45) Date of Patent: Nov. 9, 2010

(54) SEMICONDUCTOR LIGHT EMITTING DEVICE

(75) Inventors: Yan Huang, Hong Kong (HK); Kuo-An Chiu, New Territories (HK); Hua-Jun Peng, New Territories (HK); Jian Feng, New Territories (HK); Hung-Shen Chu, New Territories (HK)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 1023 days.

(21) Appl. No.: 11/516,632

(22) Filed: Sep. 7, 2006

(65) Prior Publication Data

US 2008/0061304 A1    Mar. 13, 2008

(51) Int. Cl.
*H01L 33/46* (2010.01)
(52) U.S. Cl. .................. 257/98; 257/99; 257/E33.068; 257/E33.069; 372/50.11; 372/99
(58) Field of Classification Search .................. 257/98, 257/99, E33.068, E33.069; 372/50.11, 99
See application file for complete search history.

(56) References Cited

U.S. PATENT DOCUMENTS 6,704,343 B2 * 3/2004 Deng et al. .................. 372/97

| 6,784,462 | B2 | 8/2004 | Schubert |
| 6,831,302 | B2 | 12/2004 | Erchak et al. |
| 6,943,377 | B2 | 9/2005 | Gaska et al. |
| 6,958,494 | B2 | 10/2005 | Lin et al. |
| 2005/0035354 | A1 * | 2/2005 | Lin et al. ............. 257/79 |
| 2006/0027815 | A1 | 2/2006 | Wierer, Jr. et al. |
| 2006/0081858 | A1 * | 4/2006 | Lin et al. ............. 257/85 |

FOREIGN PATENT DOCUMENTS

| CN | 1368764 | 9/2002 |
| CN | 1645637 | 7/2005 |
| WO | WO 2005/015647 | 2/2005 |

OTHER PUBLICATIONS

International Search Report Application No. PCT/CN2007/070238 dated Oct. 11, 2007.

* cited by examiner

*Primary Examiner*—Jerome Jackson, Jr.
*Assistant Examiner*—Yu Chen
(74) *Attorney, Agent, or Firm*—Buchanan Ingersoll & Rooney PC (57) ABSTRACT

A semiconductor light emitting device for emission of light having a predetermined bandwidth in a primary direction of emission includes a light generating region for the generation of light; and a 1-dimensional photonic crystal structure having a photonic bandgap covering at least a segment of said bandwidth. The 1-dimensional photonic crystal structure is located such that upon incident of light from the light generating region, light having a wavelength within the bandgap of the 1-dimensional photonic crystal structure is reflected in the primary direction of emission.

25 Claims, 6 Drawing Sheets

SEMICONDUCTOR LIGHT EMITTING DEVICE

FIELD OF THE INVENTION

The present invention relates to the structure and fabrication of semiconductor light emitting devices. More particularly, the present invention relates to improvements in light emission efficiency of semiconductor light emitting devices.

BACKGROUND OF THE INVENTION

Light emitting diodes (LEDs) are semiconductor light emitting devices that emit lights when an electrical current is supplied thereto. Typically, an LED is formed of multiple layers of materials having a layer of p-doped material or p-type semiconductor layer ("p-layer"), a layer of n-doped material or an n-type semiconductor layer ("n-layer"), and a light generating region or p-n junction. When powered, the p-n junction emits lights in a primary direction towards one of the p- and n-layers creating a field of illumination.

To improve light emission efficiency of an LED device, various techniques have been proposed by the prior art, examples of which follow.

U.S. Pat. No. 6,784,462, entitled "Light-emitting diode with planar omni-directional reflector" and issued to Fred E. Schubert on Aug. 31, 2004, discloses an omni-directional reflector disposed between a light-emitting region and a conductive holder. The reflector has a transparent layer, an array of ohmic contacts and a reflective conductive film, arranged in sequence. The ohmic contacts increase the portion of light that reaches and is reflected by the underlying reflective film, and the increased reflection, in turn, increases the light extraction efficiency of the LED. However, the LED of '462 patent has a relatively high requirement on the material of the reflective film, which needs to be electrically conductive and have a high reflectivity. Furthermore, the disposal of the reflector between the light-emitting region and the conductive holder may make the fabrication process unnecessarily complicated.

In U.S. Pat. No. 6,958,494, entitled "Light emitting diodes with current spreading layer" and issued to Lin, et al. on Oct. 25, 2005, a conductive and transparent Indium-Tin Oxide (ITO) film and an ultra-thin composite metallic layer, serving as a good ohmic contact and current spreading layer, are firstly attached onto a semiconductor cladding layer. Thereafter, holes may be etched into the semiconductor cladding layer to form a Photonic Band Gap structure to improve LED light extraction. However, the process of forming the Photonic Band Gap structure may be unnecessarily complicated. Furthermore, the etching process may cause damages to the contact layer above the semiconductor cladding layer and consequently may make the electrical contact instable.

It is an object of the present invention to provide a semiconductor light-emitting device, which overcomes at least some of the deficiencies exhibited by some of those of the prior art.

SUMMARY OF THE INVENTION

In a first aspect, there is provided a semiconductor light emitting device for emission of light having a predetermined bandwidth in a primary direction of emission. The device includes a light generating region for the generation of light; and a 1-dimensional photonic crystal structure having a photonic bandgap covering at least a segment of said bandwidth. The 1-dimensional photonic crystal structure is located such that upon incident of light from the light generating region, light having a wavelength within the bandgap of the 1-dimensional photonic crystal structure is reflected in the primary direction of emission.

In a second aspect, there is provided a semiconductor light emitting device for emission of light having a predetermined bandwidth in a primary direction of emission, the device including:
   a multi-layer stack of materials including a layer of p-doped material, a layer of n-doped material, and a light generating region therebetween; and
   a 2-dimensional photonic crystal structure located at or adjacent an upper surface of the multi-layer stack and distal of the light generating region in the primary direction of emission, wherein the 2-dimensional photonic crystal structure has a photonic bandgap covering at least a segment of said bandwidth for extracting lights from the device.

In a third aspect, there is provided a flip-chip semiconductor light emitting device for emission of light having a predetermined bandwidth in a primary direction of emission, the device including:
   a light generating region;
   a substantially transparent substrate on which the light generating region is formed, the substrate having a top emitting surface; and
   a 2-dimensional photonic crystal structure formed at or adjacent an upper surface of the substrate such that the 2-dimensional photonic crystal structure is positioned in front of the light generating region in the primary light emitting direction,
   wherein the 2-dimensional photonic crystal structure has a photonic band gap covering at least a segment of said bandwidth for extracting light from the device.

In a fourth aspect, there is provided a vertical semiconductor light emitting device for emission of light having a predetermined bandwidth in a primary direction of emission, the device including:
   a light generating region; and
   a 1-dimensional photonic crystal structure located behind the light generating region in the primary light emitting direction and acting as a reflective layer, wherein the 1-dimensional photonic crystal structure has a photonic band gap covering at least a segment of said range of wavelength.

Other aspects and advantages of the invention will become apparent from the following detailed description, taken in conjunction with the accompanying drawings, which description illustrates by way of example the principles of the invention.

BRIEF DESCRIPTION OF THE DRAWINGS

The invention now will be described, by way of example only, and with reference to the accompanying drawings in which.

DETAILED DESCRIPTION

The following description refers to exemplary embodiments of a semiconductor light emitting assembly according to the present invention. Reference is made in the description to the accompanying drawings whereby the semiconductor light emitting assembly is illustrated in the exemplary embodiments. Similar components between the drawings are identified by the same reference numerals.

Figure 1:
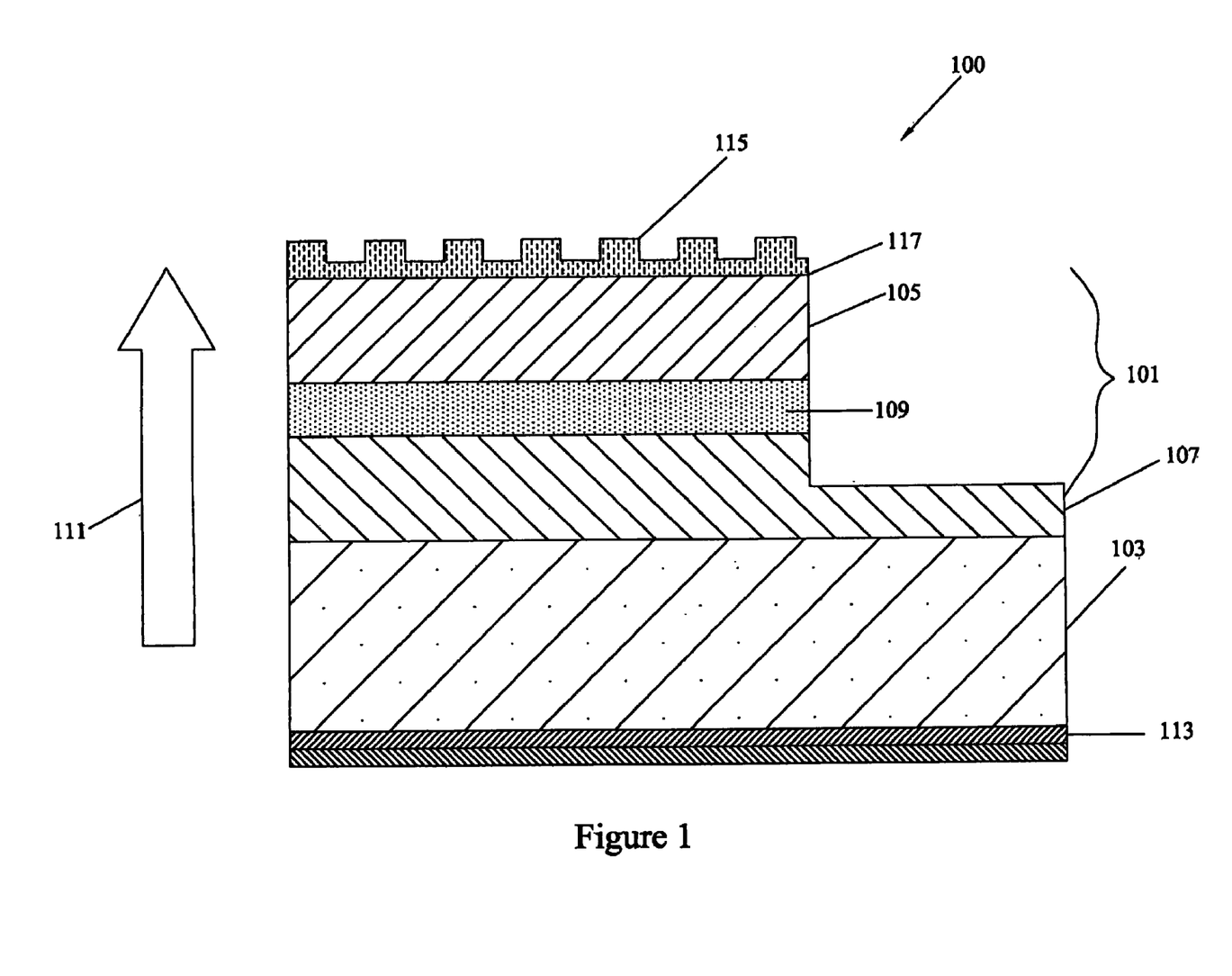
FIG. 1 shows a cross sectional view of a first embodiment of a semiconductor light emitting device according to the present invention.

In FIG. 1, an exemplary embodiment of a top-emitting semiconductor light emitting device 100 includes a multi-layer stack 101 of materials formed on a substrate 103; the multi-layer stack 101 includes a layer of p-doped material or p-type semiconductor layer 105, a layer of n-doped material or an n-type semiconductor layer 107, and a light generating region or p-n junction 109 as generally understood in the art. When powered, the p-n junction 109 emits lights in all directions, but a primary amount of light emissions will exit the top-emitting semiconductor light emitting device 100 in a primary light emitting direction indicated by arrow 111, as could be understood in the art.

In this embodiment, the substrate 103 is a transparent substrate, and the top-emitting semiconductor light emitting device 100 further includes a 1-dimensional photonic crystal structure 113 attached to a bottom surface of the substrate 103 by, for example, gluing or deposition. Alternatively, the 1-dimensional photonic crystal structure 113 can be sandwiched between the substrate 103 and the n-layer 107.

Figure 2A:
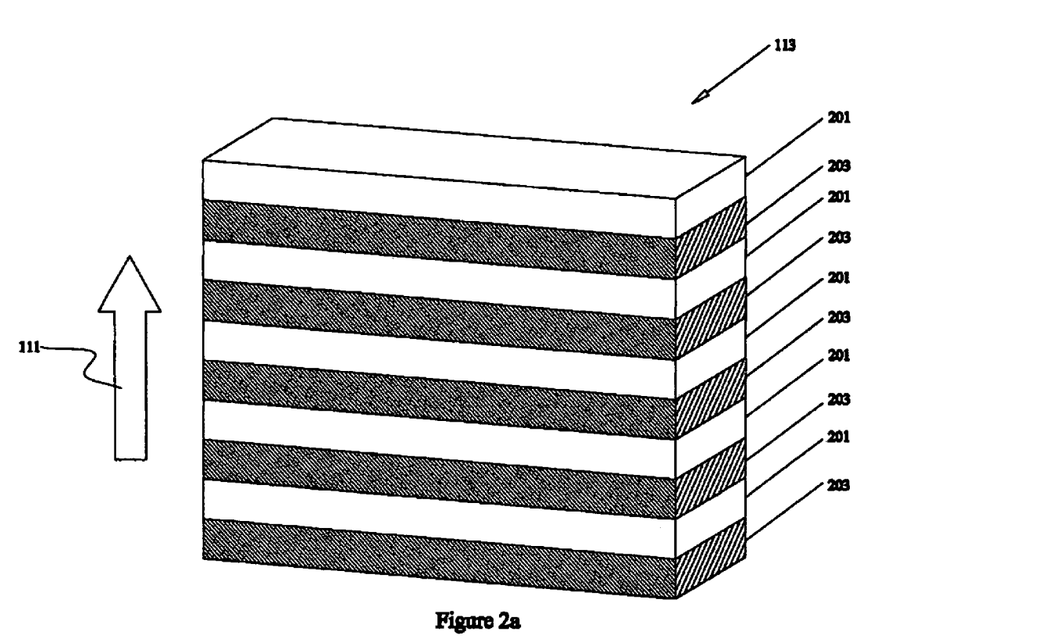
FIG. 2a is a perspective view of a 1-dimensional photonic crystal structure suitable for use in conjunction with the semiconductor light emitting device of FIG. 1.

In the exemplary embodiment, the 1-dimensional photonic crystal structure 113 acts as an omnidirectional reflector for reflecting lights that exit through the substrate 103 so as to improve the light emission efficiency in the primary light emitting direction 111. As shown in FIG. 2a, the 1-dimensional photonic crystal structure 113 has two sets of alternating layers 201, 203, each set being formed from a high and a low refractive index material respectively, such that the structure 113 exhibits periodicity in one dimension substantially parallel to the primary light emitting direction 111. In the exemplary embodiment, the number of the layers of the 1-dimensional photonic crystal structure is in a range of 2 to 128, preferably 8 to 64. In the exemplary embodiment, the first and second materials are selected from a group of $TiO_2$, $SiO_2$, $Si_3N_4$, and $Ta_2O_5$, and preferably have a relatively high refractive index contrast.

Furthermore, the 1-dimensional photonic crystal structure 113 has a lattice constant of approximately one fourth of the photonic band gap of the 1-dimensional photonic crystal structure, and the photonic band gap of the 1-dimensional photonic crystal structure 113 is designed to cover at least a segment of the wavelength range of the light emissions from the p-n junction 109, not shown in FIG. 2a, and is in the range of 400-800 nm in the exemplary embodiment, preferably in the range of 440-470 nm, 500-540 nm or 600-650 nm. It will be understood by a skilled person in the art that lights which penetrate through the substrate 103, again not shown in FIG. 2a, will be reflected substantially in a lossless manner by the 1-dimensional photonic crystal structure 113, regardless of their incident angles at which the lights penetrates into the 1-dimensional photonic crystal structure 113. Thereby, a substantial amount of light from the p-n junction 109 in a direction opposite to the primarily light emitting direction 111 is reflected by the 1-dimensional photonic crystal structure 113 such that light emission efficiency in the primary light emitting direction 111 is increased.

As shown in FIG. 1, the top-emitting semiconductor light emitting device 100 further includes a 2-dimensional photonic crystal structure 115 attached to a top surface 117 of the p-layer 105 by, for example, gluing, deposition, evaporation or imprinting. The 2-dimensional photonic crystal structure is in front of the multi-layer stack 101 in the light emitting direction 111 for extracting lights out of the light emitting device 100. The photonic band of the 2-dimensional photonic crystal structure 115 also covers at least a segment of the range of wavelength the light emissions from the p-n junction 109 and is in the range of 400-800 nm in the exemplary embodiment, preferably in the range of 430-480 nm. Such a 2-dimensional photonic crystal structure 115 assist extraction of lights out of the light emitting device 100 in the primary light emitting direction 111 as will be understood by a skilled person in the art.

Figure 2B:
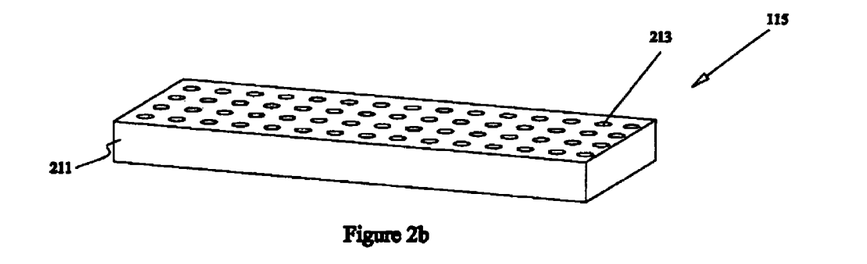
FIG. 2b is a perspective view of a 2-dimensional photonic crystal structure suitable for use in conjunction with the semiconductor light emitting device of FIG. 1.

As shown in FIG. 2b, in the exemplary embodiment, a plurality of holes 213 are created on a conductive and transparent film, for example, ITO (Indium Tin Oxide) thin film 211, and are periodically arranged in two dimensions defined by the ITO film 211 to form the 2-dimensional photonic crystal structure 115, such as by etching, electron beam lithograph process, nano-imprinting process or holography technology. The 2-dimensional photonic crystal structure 115 also functions as a contact layer for the p-type semiconductor layer 105 in the exemplary embodiment.

Figure 3:
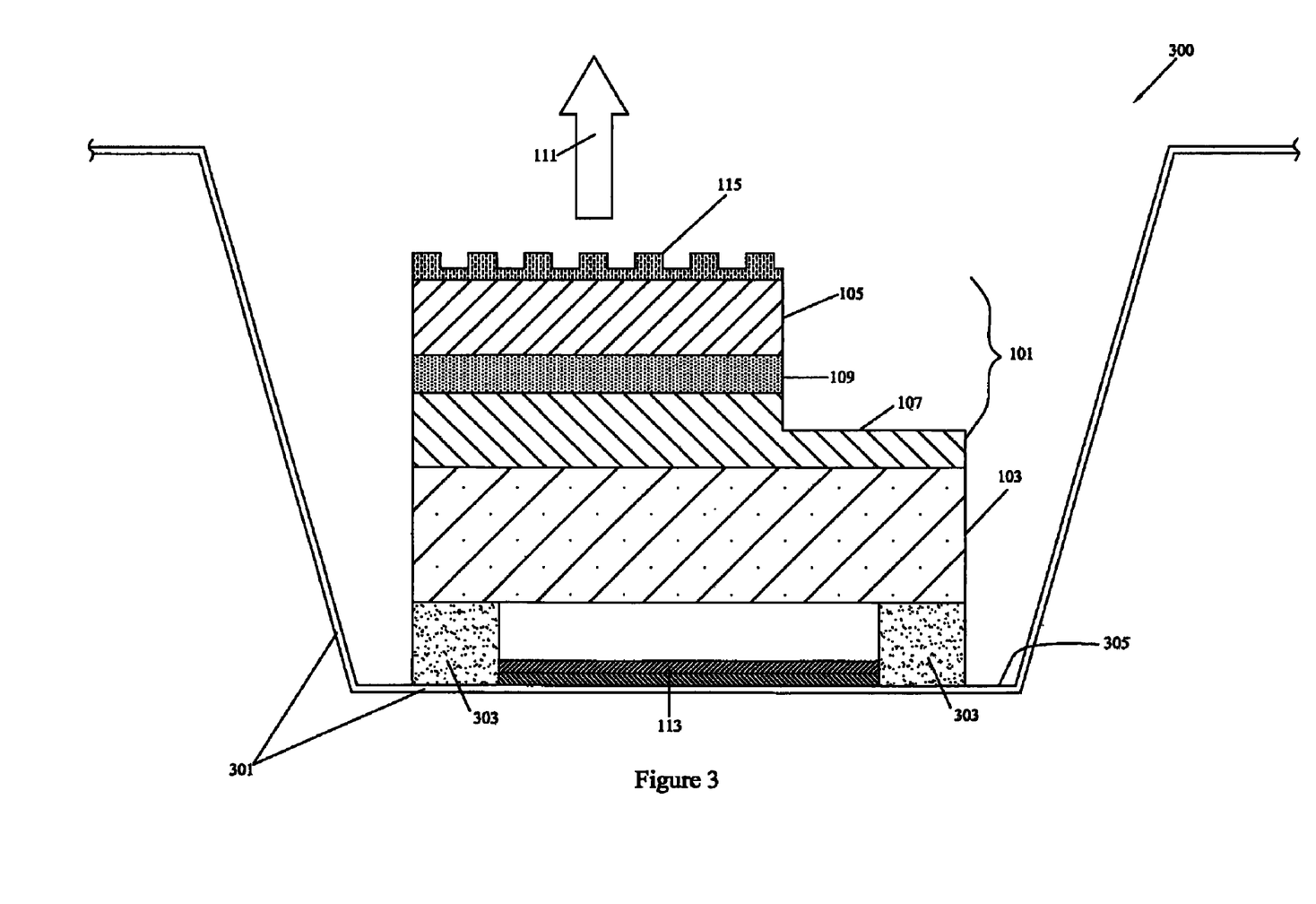
FIG. 3 shows a cross sectional view of a second embodiment of a semiconductor light emitting device according to the present invention.

FIG. 3 illustrates a second embodiment of a top-emitting semiconductor light emitting device 300 according to the present invention. The light emitting device has a structure similar to the embodiment as depicted in FIG. 1, however, mounted onto an LED housing holder 301 by solders 303, and the 1-dimensional photonic crystal structure 113 is attached onto a top surface 305 of the LED housing holder 301 for reflecting light that has passed through the substrate 103. By forming the 1-dimensional photonic crystal structure 113 on the LED housing holder, fabrication of such a light emitting device can be simplified.

Figure 4:
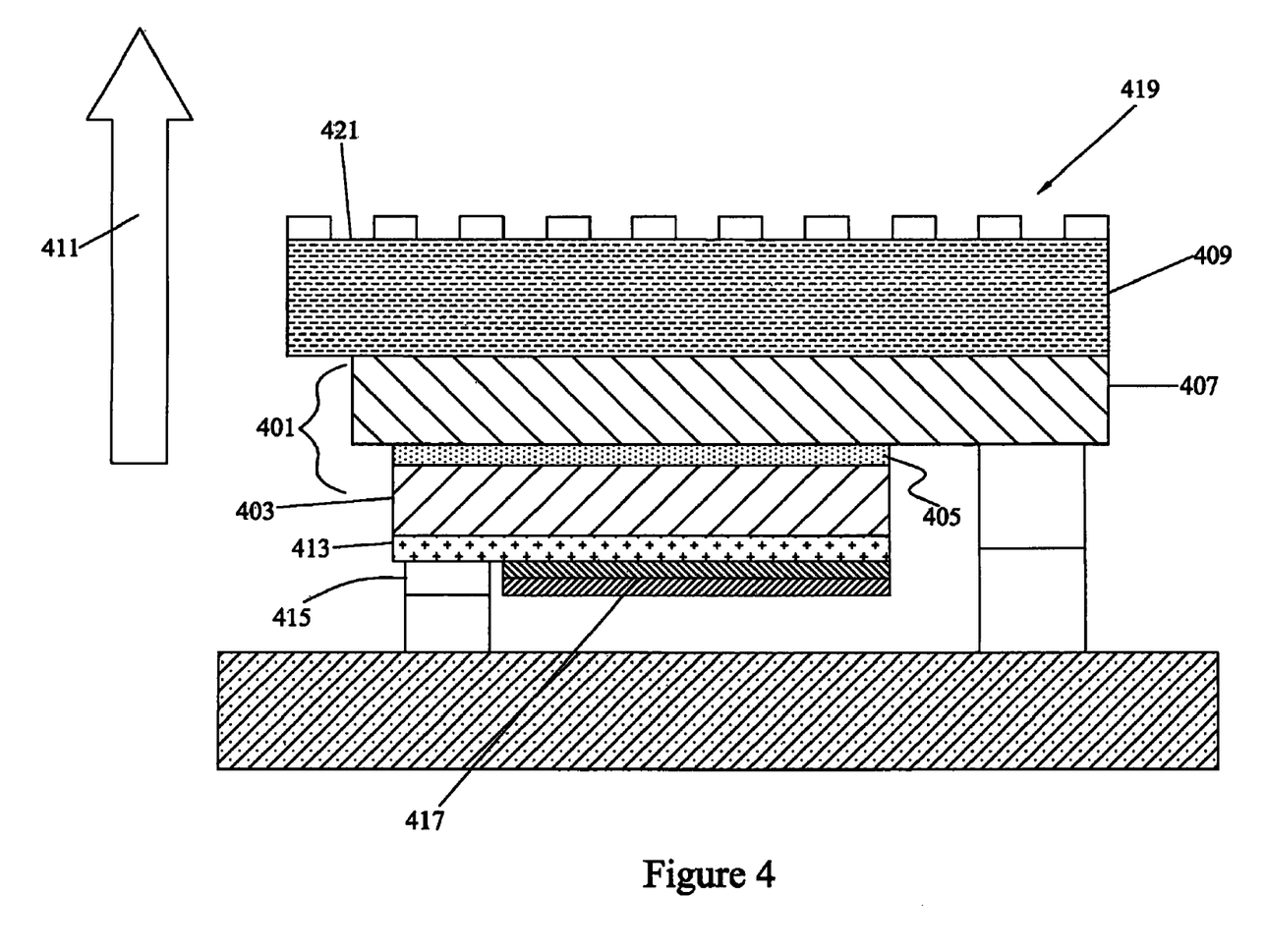
FIG. 4 shows a cross sectional view of a third embodiment of a semiconductor light emitting device according to the present invention.

In FIG. 4, a further embodiment of the present invention is show in the form of a flip-chip semiconductor light emitting device 400. The flip-chip light emitting device 400 has a multi-stack 401 including a layer of p-doped material or p-type semiconductor layer 403, a layer of n-doped material or an n-type semiconductor layer 407, and a light generating region or p-n junction 405 as generally understood in the art. When powered, the p-n junction 405 emits lights in all directions, but a primary amount of light emissions will exit the flip-chip semiconductor light emitting device 400 through a substantially transparent substrate 409 attached to a top surface of the n-layer 407 in a primary light emitting direction indicated by arrow 411. In the exemplary embodiment, a transparent conductive film, for example, an ITO film 413 is attached to the p-layer 403 for improving electrical connections between the p-layer and p-electrode 415. A 1-dimensional photonic crystal structure 417 is attached to the ITO film 413 acting as an omnidirectional reflector for reflecting light that exits through the p-layer 403 and ITO film 413 so as to improve the light emission efficiency in the primary light emitting direction 411. Furthermore, a 2-dimensional photonic crystal structure 419 is formed at a top surface 421 of the substrate 409 for extracting light from the flip-chip semiconductor light emitting device 400 in the primary light emitting direction 411, such as by etching the substrate 409 to create periodically arranged holes thereon. Alternatively, the 2-dimensional photonic crystal structure can be an individual patterned transparent layer attached onto the substrate 409. In addition, the 2-dimensional photonic crystal structure 419 may also be sandwiched between the substrate 409 and the n-layer 407.

Figure 5:
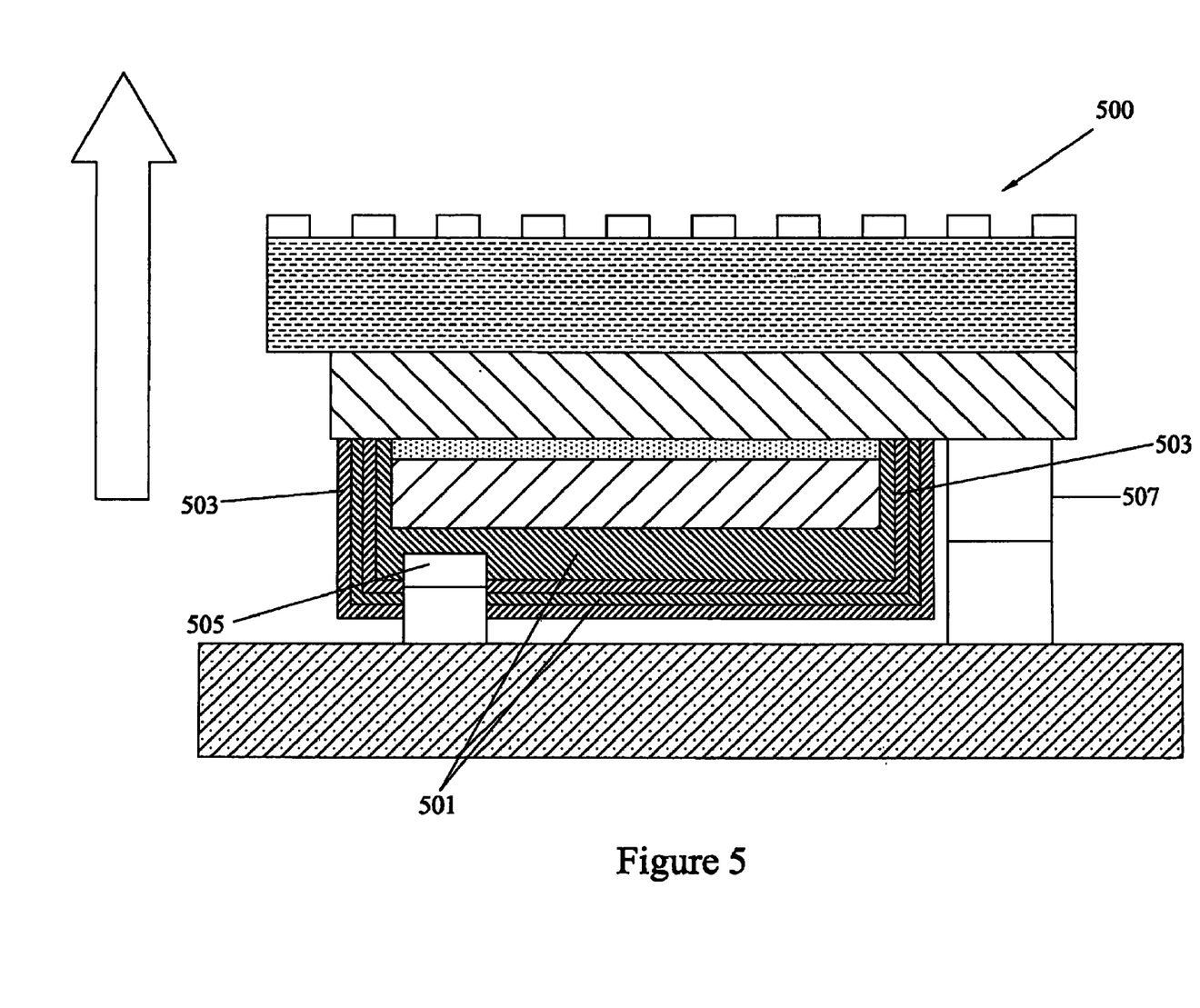
FIG. 5 shows a cross sectional view of a fourth embodiment of a semiconductor light emitting device according to the present invention.

FIG. 5 illustrates another embodiment of a flip-chip semiconductor light emitting device 500, in which the 1-dimensional photonic crystal structure 501 extends into the mesa region 503 between the p-contact 505 and n-contact 507 and also acts as a dielectric passivation layer for isolation purpose.

Figure 6:
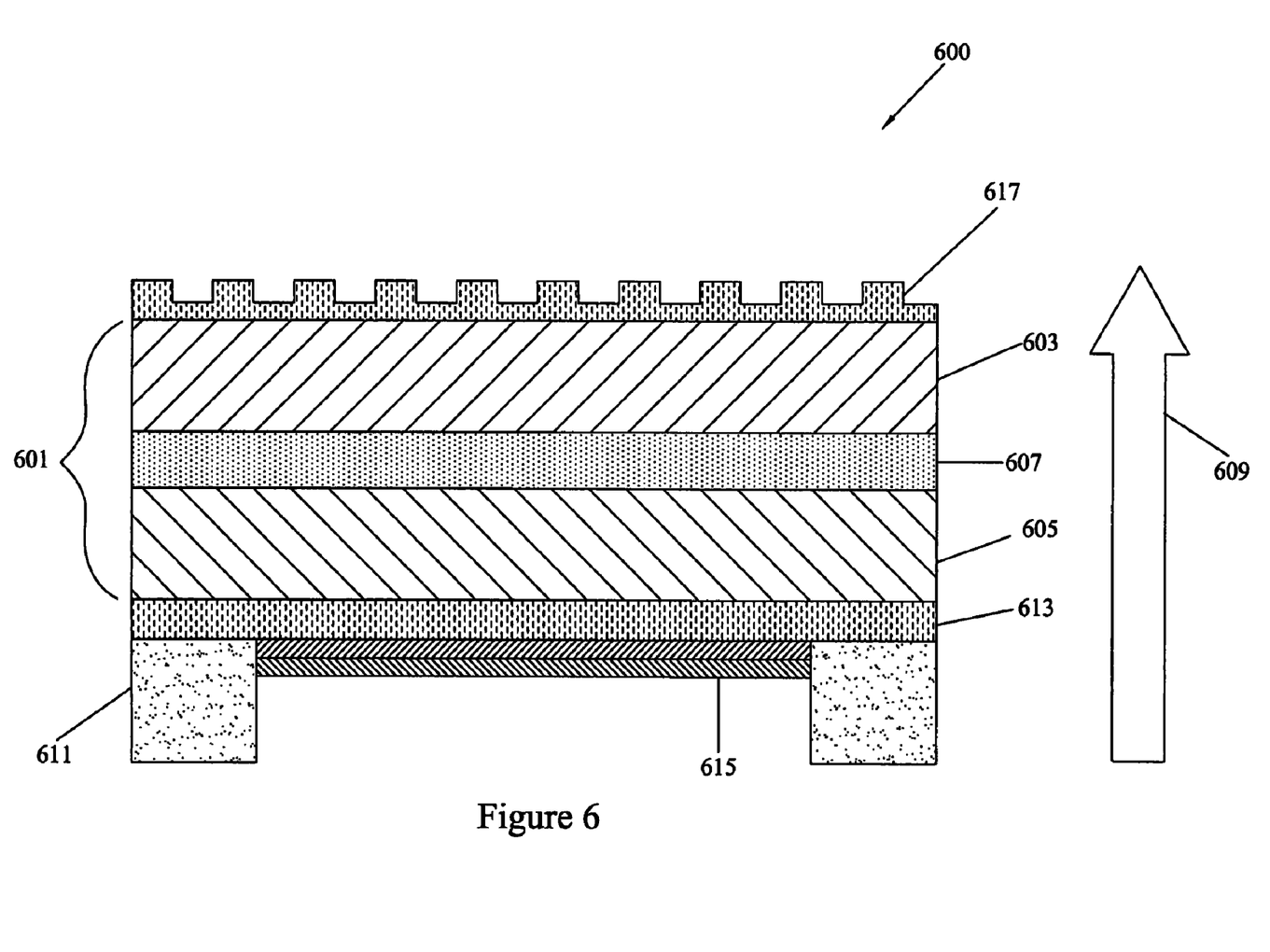
FIG. 6 shows a cross sectional view of a fifth embodiment of a semiconductor light emitting device according to the present invention

In FIG. 6, an exemplary embodiment of a vertical semiconductor light emitting device 600 includes a multi-layer stack 601 having a p-layer 603, n-layer 605, and a p-n junction 607 therebetween which when powered emits light in a primary direction of emission as indicated by arrow 609. An n-electrode 611 is provided and is in electrical connection with the n-layer 605 for supplying power thereto. A transparent conductive layer, for example, an ITO film 613, can be provided between the n-layer 605 and the n-electrode 611 for improving the electrical connections therebetween.

Furthermore, similar to the exemplary embodiments depicted in FIGS. 1 and 3-5, a 1-dimensional photonic crystal structure 615 is provided on or adjacent a bottom surface of the ITO film 613 for reflecting light that exits through the n-layer 605 and ITO film 613 so as to improve the light emission efficiency in the primary light emitting direction 609, and a 2-dimensional photonic crystal structure 617 is formed at an upper surface of the p-layer 603 for extracting lights from the vertical semiconductor light emitting device 600 in the primary light emitting direction 609. The 2-dimensional photonic crystal structure 617 can be formed by etching a transparent conductive layer, which can also function as a p-electrode in the exemplary embodiment.

It will be understood that the invention disclosed and defined herein extends to all alternative combinations of two or more of the individual features mentioned or evident from the text or drawings. All of these different combinations constitute various alternative aspects of the invention. The foregoing describes an embodiment of the present invention and modifications, apparent to those skilled in the art can be made thereto, without departing from the scope of the present invention.

Although the invention is illustrated and described herein as embodied, it is nevertheless not intended to be limited to the details described, since various modifications and structural changes may be made therein without departing from the spirit of the invention and within the scope and range of equivalents of the claims.

Furthermore, it will be appreciated and understood that the words used in this specification to describe the present invention and its various embodiments are to be understood not only in the sense of their commonly defined meanings, but also to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word itself. The definitions of the words or elements of the following claims are, therefore, defined in this specification to include not only the combination of elements which are literally set forth, but all equivalent structure, material or acts for performing substantially the same function in substantially the same way to obtain substantially the same result, without departing from the scope of the invention.

What is claimed is:

1. A semiconductor light emitting device for emission of light having a predetermined bandwidth in a primary direction of emission, the device comprising:
    a light generating region for the generation of light;
    a multi-layer stack of materials including a layer of p-doped material and a layer of n-doped material, each adjacent to the light generating region, respectively, the multi-layer stack having an upper emitting surface and an opposed lower emitting surface;
    a 2-dimensional photonic crystal structure located at or adjacent the upper emitting surface of said multi-layer stack for extraction of light of said predetermined bandwidth;
    an electrically conductive and transparent substrate disposed adjacent the lower emitting surface of the multi layer stack of materials, said substrate extending across and being in electrical communication across the lower emitting surface of said multi-layer stack of materials, and being transparent to at least a segment of light of said predetermined bandwidth emitted via the lower emitting surface of the multi layer stack of materials;
    an n-electrode in electrical communication with the electrically conductive and transparent substrate at a first portion and a second portion of said substrate, said first portion and said second portion being spaced apart from each other; and
    a 1-dimensional photonic crystal structure having a photonic bandgap covering at least said segment of light of said predetermined bandwidth, said 1-dimensional crystal structure being located distal of the 2-dimensional photonic crystal structure and being located adjacent the lower emitting surface of said multi layer stack and being interposed between said first portion and said second portion of the substrate where said n-electrode is in electrical communication with the substrate,
    wherein the 1-dimensional photonic crystal structure is of a predetermined thickness so as to substantially reflect said segment of light of said predetermined wavelength emitted via the lower emitting surface of the multi layer stack of materials back in the primary direction of emission and back toward the 2-dimensional photonic crystal structure, and
    wherein said substrate provides electrical connection from the n-electrode to the multi layer stack of materials across the lower emitting surface of the multi layer stack of materials, and allows transmission therethrough of the light reflected from the 1-dimensional photonic crystal and across the lower emitting surface of the multi layer stack of materials in the primary direction of emission.

2. The device of claim 1, wherein the 1-dimensional photonic crystal structure includes a plurality of periodically arranged layers of a first material and a second material of different refractive indexes, respectively.

3. The device of claim 2, wherein the first and second materials are selected from a group consisting of $TiO_2$, $SiO_2$, $Si_3N_4$, and $Ta_2O_5$.

4. The device of claim 2, wherein the first and second materials have a relatively high refractive index contrast therebetween.

5. The device of claim 1, further comprising a packaging for holding said device, wherein the 1-dimensional photonic crystal structure is located at or adjacent to a top surface of the packaging.

6. The device of claim 1, wherein the 1-dimensional photonic crystal structure forms an omnidirectional reflector.

7. The device of claim 1, wherein the photonic band gap of the 1-dimensional photonic crystal structure is in the range of 400 to 800 nm.

8. The device of claim 7, wherein the photonic band gap of the 1-dimensional photonic crystal structure is in the range of one of (i) about 440 nm to 470 nm, (ii) about 500 nm to 540 nm, and (iii) about 600 nm to 640 nm.

9. The device of claim 1, wherein the 1-dimensional photonic crystal structure has a lattice constant of approximately one quarter of the photonic band gap of the 1-dimensional photonic crystal structure.

10. The device of claim 1, wherein the 1-dimensional photonic crystal structure has a number of 2 to 128 layers.

11. The device of claim 1, wherein the 2-dimensional photonic crystal structure is constituted by a patterned transparent electrode layer.

12. The device of claim 11, wherein the transparent electrode layer is an Indium-Tin Oxide (ITO) electrode layer.

13. A vertical semiconductor light emitting device for emission of light having a predetermined bandwidth in a primary direction of emission, the device comprising:
a light generating region;
a multi-layer stack of materials including a layer of p-doped material and a layer of n-doped material, each layer being located adjacent the light generating region, the multi-layer stack having an upper emitting surface and an opposed lower emitting surface;
a 2-dimensional photonic crystal structure located at or adjacent the upper emitting surface of said multi-layer stack for extraction of light of said predetermined bandwidth;
an electrically conductive and transparent substrate disposed adjacent the lower emitting surface of the multi layer stack of materials, said substrate extending across and being in electrical communication across the lower emitting surface of said multi-layer stack of materials, and being transparent to at least said a segment of light of said predetermined bandwidth emitted via the lower emitting surface of the multi layer stack of materials;
an n-electrode in electrical communication with the electrically conductive and transparent substrate at a first portion and a second portion of said substrate, said first portion and said second portion being spaced apart from each other; and
a 1-dimensional photonic crystal structure having a photonic band gap covering at least said segment of light of said predetermined bandwidth, said 1-dimensional crystal structure being located distal of the 2-dimensional photonic crystal structure and being located adjacent the lower emitting surface of said multi layer stack and being interposed between said first portion and said second portion of the substrate where said n-electrode is in electrical communication with the substrate;
wherein the 1-dimensional photonic crystal structure is of a predetermined thickness so as to substantially reflect said segment of light of said predetermined wavelength emitted via the lower emitting surface of the multi layer stack of materials back in the primary direction of emission and back toward the 2-dimensional photonic crystal structure, and
wherein said substrate provides electrical connection from the n-electrode to the multi layer stack of materials across the lower emitting surface of the multi layer stack of materials, and allows transmission therethrough of the light reflected from the 1-dimensional photonic crystal and back across the lower emitting surface of the multi layer stack of materials in the primary direction of emission.

14. A device as claimed in claim 13, wherein the n-electrode and the 1-dimensional photonic crystal structure are arranged in direct contact with the transparent substrate.

15. A device as claimed in claim 13, wherein the 1-dimensional photonic crystal structure includes at least a first layer and a second layer.

16. A device as claimed in claim 15, wherein the first and second layers include different refractive indexes.

17. A device as claimed in claim 15, wherein the first and second layers include different first and second materials, respectively.

18. A device as claimed in claim 17, wherein a relatively high refractive index contrast is defined between the first and second materials.

19. A device as claimed in claim 15, wherein the first and second layers include at least one of $TiO_2$, $S1O_2$, $Si_3N_4$, and $Ta_2O_5$.

20. A device as claimed in claim 15, wherein the 1-dimensional photonic crystal structure includes between 2 to 128 layers.

21. A device as claimed in claim 13, wherein the photonic band gap of the 1-dimensional photonic crystal structure is in the range of 400 to 800 nm.

22. A device as claimed in claim 13, wherein the photonic band gap of the 1-dimensional photonic crystal structure is in the range of one of (i) about 440 nm to 470 nm, (ii) about 500 nm to 540 nm, and (iii) about 600 nm to 650 nm.

23. A device as claimed in claim 13, wherein the 1-dimensional photonic crystal structure includes a lattice constant of approximately one quarter of the photonic band gap of the 1-dimensional photonic crystal structure.

24. A device as claimed in claim 13, wherein the 2-dimensional photonic crystal structure is constituted by a patterned transparent electrode layer.

25. A device as claimed in claim 24, wherein the transparent electrode layer includes an Indium-Tin Oxide (ITO) electrode layer.

* * * * *